United States Patent [19]

Stansell

[11] Patent Number: 5,886,582
[45] Date of Patent: *Mar. 23, 1999

[54] ENABLING CLOCK SIGNALS WITH A PHASE LOCKED LOOP (PLL) LOCK DETECT CIRCUIT

[75] Inventor: Galen E. Stansell, Kirkland, Wash.

[73] Assignee: Cypress Semiconductor Corp., San Jose, Calif.

[*] Notice: The term of this patent shall not extend beyond the expiration date of Pat. No. 5,822,387.

[21] Appl. No.: 693,735

[22] Filed: Aug. 7, 1996

[51] Int. Cl.[6] ............................ H03L 7/095; H03K 5/135
[52] U.S. Cl. .............................. 331/1 A; 331/2; 331/17; 331/25; 331/DIG. 2; 327/143; 327/147; 327/156; 327/299
[58] Field of Search .................................. 331/1 A, 2, 11, 331/12, 14, 17, 18, 25, DIG. 2; 327/142, 143, 156–159, 218, 299, 147–150

[56] References Cited

U.S. PATENT DOCUMENTS

| 5,008,635 | 4/1991 | Hanke et al. | 331/1 A |
| 5,294,894 | 3/1994 | Gebara | 331/1 A |
| 5,347,232 | 9/1994 | Nishimichi | 331/1 A |
| 5,467,042 | 11/1995 | Smith et al. | 327/293 |

OTHER PUBLICATIONS

*Shariatdoust et al.* (AT&T Bell Laboratories), IEEE 1992 Custom Integrated Circuits Conference, pp. 24.2.1–24.2.5. "A Low Jitter 5MHz to 180 MHz Clock Synthesizer for Video Graphics".

*Alvarez et al.*, 1994 Symposium on VLSI Circuits Digest of Technical Papers, pp. 37–38. "A Wide Bandwidth Low–Voltage PLL for Power PC™ Micro processors".

Preliminary Data Sheet for Part CY2291, High Performance Data Handbook, Cypress Semiconductor, Pub. May 1995, pp. 10–13 to 10–17.

*Primary Examiner*—David Mis
*Attorney, Agent, or Firm*—Maiorana & Acosta, P.C.

[57] ABSTRACT

A circuit for enabling and disabling generation of an output clock signal is disclosed. The circuit includes a PLL lock detect circuit that generates an active lock control signal when an output reference signal of a phase lock loop (PLL) circuit is phase locked relative to an input reference signal to the PLL. The output reference signal of the PLL, and the lock signal from the lock detect circuit, are both provided to a clock enable circuit. The clock enable circuit includes a negative edge-triggered D-type flip-flop and a two-input AND gate. The lock signal is applied to the D-input of the flip-flop, while the clock signal is applied to the clock input of the flip-flop. The lock signal is generated asynchronously relative to the input clock signal. Therefore, the flip-flop samples the lock signal on each falling edge of the clock signal so as to synchronize the lock signal relative to the input clock signal. The sampled lock signal, and the input clock signal (formed from the PLL output reference signal) are provided on respective input terminals of the AND gate. The output of the AND gate defines the output clock signal.

22 Claims, 4 Drawing Sheets

ENABLING CLOCK SIGNALS WITH A PHASE LOCKED LOOP (PLL) LOCK DETECT CIRCUIT

INCORPORATION BY REFERENCE

This application is related to co-pending application entitled "AN APPARATUS FOR FAST PHASE-LOCKED LOOP FREQUENCY SLEWING DURING POWER ON", Ser. No. 08/622,531, filed Mar. 25, 1996, now U.S. Pat. No. 5,822,387 Attorney Docket No. 64,663-033 (CD96019), which is commonly owned by the assignee of the present invention, and hereby incorporated by reference. This application is also related to co-pending application entitled "AN ADJUSTABLE LOCK DETECTOR FOR A PHASE-LOCKED LOOP", Ser. No. 08/622,539, filed Mar. 25, 1996, now U.S. Pat. No. 5,724,007, Attorney Docket No. 64,663-032 (CD96018), which is commonly owned by the assignee of the present invention, and hereby incorporated by reference.

BACKGROUND OF THE INVENTION

1. Field of the Invention

The present invention relates generally to a system for enabling clock signals, and, more particularly, to a system that enables and disables clock signals based upon a lock state of a PLL circuit.

2. Description of the Related Art

There has been much investigation concerning the design of clock generating circuitry, owing in no small part to its importance in modern synchronous systems, including computing systems. Specifically, there has been some progress in the development of clock generation circuitry that meets modern day performance requirements. One requirement is that the circuitry only output clock signals having stable frequencies. Moreover, another requirement is that such circuitry output only valid frequencies. In a common configuration, a phase locked loop (PLL) circuit is employed to generate an output reference signal that is phase locked relative to an input reference signal.

One design approach taken in the art has been merely to use the output reference signal of the PLL as an output clock. This approach has, depending on the application, several shortcomings, not the least of which includes the existence of a condition where the output reference signal is neither of a valid frequency, nor is stable. This situation almost always occurs when the device containing such clock generation circuitry is initially powered up. By way of background, it is fairly well known that a PLL circuit is characterized by an overall transfer function. Accordingly, before a voltage controlled oscillator (VCO) portion (or equivalents thereof) of the PLL locks its output to the PLL input reference signal, a period elapses wherein the VCO output signal oscillates, relative to the input reference signal (i.e., it undershoots, and overshoots the input reference signal). Thus, before a steady state, phase-locked condition is achieved, an interval known as a "pull in" or "settling" interval occurs. Thus, it should be appreciated that although the output of the PLL may be at a valid frequency (temporarily), such frequency is not stable, but rather, may only be a transitory condition. This condition, although perhaps lasting several clock cycles, is not a steady-state phase-locked condition. Therefore, directly using a PLL output may be undesirable for certain applications.

Another approach taken in the art has addressed the above-described power up oscillation. This approach selectively enables and disables the output clock signal for preselected intervals (fixed and arbitrarily selected). The structure for accomplishing this may include a conventional power-on-reset circuit, used in combination with a delay circuit. The conventional power-on-reset circuit may generally be formed using resistor chains, and provides a low-level output until the power supply has reached a predetermined operating level, and has stabilized, at which time it outputs a high level signal. This high level signal is then delayed by a predetermined amount by the delay circuit. The delay circuit output is then used to enable and disable clock signals.

One disadvantage of this approach is that, unless the enabling circuitry is very conservatively designed, the output clock signal may be permitted to be generated, even though the PLL is not phase locked. In particular, the predetermined amount of delay inserted by the delay circuit, in addition to the delay associated with the conventional power-on-reset circuit, must be selected to be long enough to accommodate the worst case PLL lock time. This is not a good solution since the overall design of such a circuit with an adequate delay is fairly difficult. Further, in some cases, the output clock signal will still be disabled, even though the PLL has, in fact, reached "lock".

Moreover, the use of the conventional power-on-reset circuitry may introduce reliability problems into the operation of the overall circuit. Specifically, the above-referred to conventional approach for designing power-on-reset circuits (resistor chains) may result in a device that exhibits performance parameters (i.e., trip levels) that are undesirably variable across both fabrication process variations, as well as temperature (operating) variations. Thus, the power-on-reset circuit could, under some circumstances, trip at a level that is either too high or too low. For purposes of illustration only, assume that for a 3.3 volt device, a conventional setup specifies a nominal power-on-reset trip point of 2 volts. However, due to the above-described undesirable variations in performance, the power-on-reset circuit may, in fact, trip at 3.0 volts. Further, in a common configuration, a 3.3 volt part may be specified to operate within a range of between 3.0–3.6 volts. Thus, an undesirable situation arises wherein the circuit could trip even though the power supply is operating within specification. Finally, the conventional approach using conventional power-on-reset circuits only works during power-up of the device.

Thus, there is a need to provide an improved system for enabling, and disabling clock signals that minimizes or eliminates one or more of the problems as described above.

SUMMARY OF THE INVENTION

It is one object of the present invention to provide a system to enable only stable and valid frequencies for output as the clock signal, anytime during the operation of the device (as opposed to only during power up of the device). It is another object of the invention to provide for reliable and stable operation under normal operating temperature variation, as well as over normal fabrication process variation. It is yet a further object of the present invention to provide a system that is relatively straightforward to design and implement, and which disables the output clock only for the time in which the output clock signal is either unstable, or invalid (as opposed to disabling the output clock a relatively long, fixed time calculated to cover the worst case PLL "pull-in" time).

These and other features and advantages are provided by a method, and a circuit, in accordance with the present invention. The method involves the operation of a clock signal generator and includes the step of generating an output clock signal using an input clock signal according to a lock control signal which corresponds to a lock state of a PLL. This method has the advantage of enabling an output clock signal as soon as the PLL achieves lock, regardless of variation in the actual PLL lock time. Moreover, the operation of a PLL circuit may be more reliable than that of a conventional power-on-reset circuit, thereby eliminating the performance variations described in the Background. Thus, this invention may eliminate, in some cases, the need or desirability for a conventional power-on-reset circuit in a clock generator device.

In a preferred embodiment of this invention, a clock circuit corresponding to the above-referenced method is provided, and includes means, such as a lock detector, for generating a lock signal corresponding to a lock state of a phase locked loop (PLL), means, such as a negative edge-triggered D-type flip-flop, for synchronizing the lock signal with respect to the input clock signal, and, means, such as a logical AND gate, for generating the output clock signal. The clock detector generates the lock signal in an active state when an output reference signal of the PLL is phase locked relative to an input reference signal to the PLL. The D-type flip-flop (DFF) synchronizes the lock signal to the input clock, which may be asserted asynchronously with respect to the input clock signal, to generate a synchronized lock signal. The logical AND function processes the input clock signal, and the synchronized lock signal to produce the output clock signal.

In an alternate embodiment, a conventional PLL lock detector circuit is used so that when frequency slewing occurs, the output clock signal is "blanked" (i.e., held low) until a valid and stable frequency output has been reached. This feature is especially useful where external devices, which may require "blanking" until a stable and valid frequency is reached, are employed in connection with the embodiment.

In yet a further embodiment, two PLL's (i.e., a primary PLL, and a secondary PLL) are used to provide a power-on-reset function.

Other objects, features, and advantages of the present invention will become apparent to one skilled in the art from the following detailed description and accompanying drawings illustrating features of this invention by way of example, but not by way of limitation.

DETAILED DESCRIPTION OF THE PREFERRED EMBODIMENTS

Figure 1:
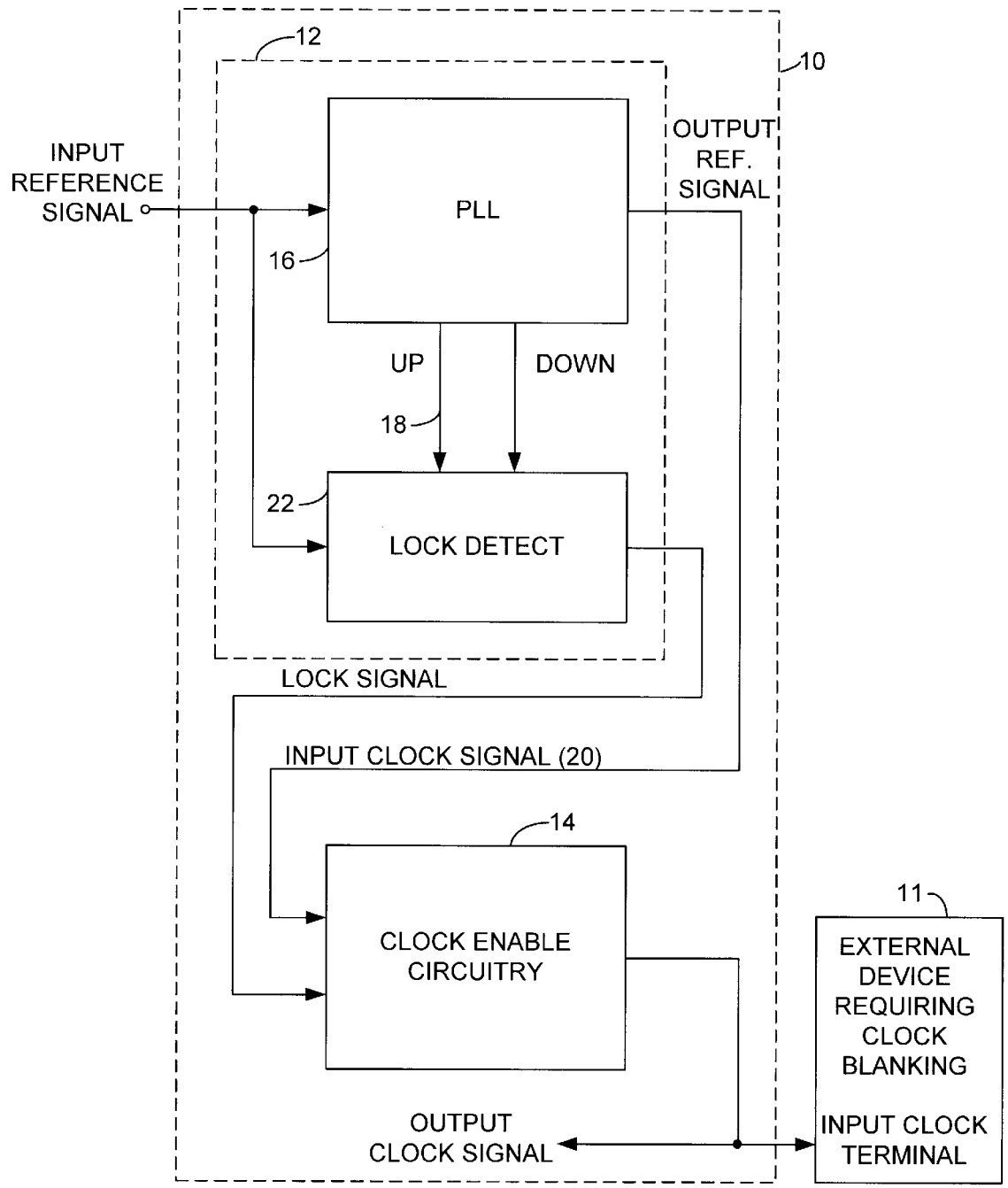
FIG. 1 is a simplified schematic and block diagram view illustrating a semiconductor device including a clock circuit according to the present invention.

Referring now to the drawings wherein like reference numerals are used to identify identical components in the various views, FIG. 1 shows an exemplary semiconductor device in which the present invention may be profitably employed, such as a clock generator integrated circuit 10. Circuit 10 is responsive to an input reference signal, which may originate from an input reference signal source (e.g., an external crystal, an external PLL, or other clock signal generating device), and responds by generating an output clock signal, according to the present invention. In one embodiment, the output clock signal may be "blanked" (i.e., held low) while the output clock signal is either unstable, at an invalid frequency, or both. Thus, one use of an embodiment of the present invention is with an external device 11 (FIG. 1) that requires clock signal blanking. This may be the case where external device 11 does not have sufficient input signal conditioning/processing characteristics to handle such signals. Unless the input thereto is "blanked", device 11 may falsely lock onto a signal having a frequency other than the desired frequency, while the generating source (i.e., in this case, device 10) "locks" in to the valid frequency. This "locking" in process may occur during start-up, or, during frequency slewing. Details of an exemplary clock generator which may be used in connection with the present invention may be found in a document entitled "Three-PLL Clock Generator Preliminary CY2291", available from the assignee of the present invention.

In one embodiment of the present invention, clock generator 10 includes means or circuit 12 for generating a lock signal, and means or circuit 14 for enabling and disabling an output clock signal as a function of a control signal corresponding to the lock signal. As will be described, the control signal may be either the lock signal itself, or a synchronized version of the lock signal.

Circuit 12 includes a phase lock loop (PLL) circuit 16 that generates a lock indicative signal 18 and an output reference signal 20, and a lock detect circuit 22. PLL circuit 16 is used to produce the output reference signal 20 that is phase locked to the input reference signal. That is, the output reference signal is substantially of the same frequency (i.e., the same frequency as after it may be divided in a feedback path by a feedback counter/divider) and phase as the input reference signal. As should be appreciated by one of ordinary skill in the art, the basic PLL circuit 16 may include three major parts: a phase/frequency detector (PFD), a loop filter, usually a low-pass filter, and a voltage controlled oscillator (VCO). It should be further appreciated that a phase detector is what is essential to the PLL, the PFD being a specialized case of the phase detector. In a common configuration, a charge pump is also used. PLL 16, in a charge pump embodiment, generates an UP signal and a DOWN signal, which collectively define the lock indicative signal 18. The UP and DOWN signals are indicative of whether, and the extent to which, the output reference signal is phase locked to the input reference signal. The basic setup of PLL 16, and its operation are well-understood in the art. For example, copending patent application entitled "AN APPARATUS FOR FAST PHASE-LOCKED LOOP FREQUENCY SLEWING DURING POWER ON", Ser. No. 08/622,531, filed Mar. 25, 1996, discloses a phase locked loop (PLL) circuit suitable for use in the present invention.

Lock detect circuit 22 provides the means for generating the lock control signal, which corresponds to the lock state of PLL 16. In particular, lock detect circuit 22 receives as inputs the lock indicative signals (e.g., the UP and DOWN signals), and the input reference signal. Lock detect circuit 22 responds by outputting the lock signal in an active state when the output reference signal is phase locked to the input reference signal (within a predetermined error margin). Lock detector 22 may be a conventional circuit found in the art. Preferably, however, lock detect circuit 22 may comprise an adjustable lock detector which includes an adjustable phase error threshold level, as well as other adjustable features, as disclosed in copending patent application entitled "AN ADJUSTABLE LOCK DETECTOR FOR A PHASE-LOCKED LOOP CIRCUIT", filed Mar. 25, 1996, Ser. No. 08/622,539. It should be appreciated that other lock detect structures suitable for use in the present invention may be employed without departing from the spirit and scope of this invention.

Figure 2:
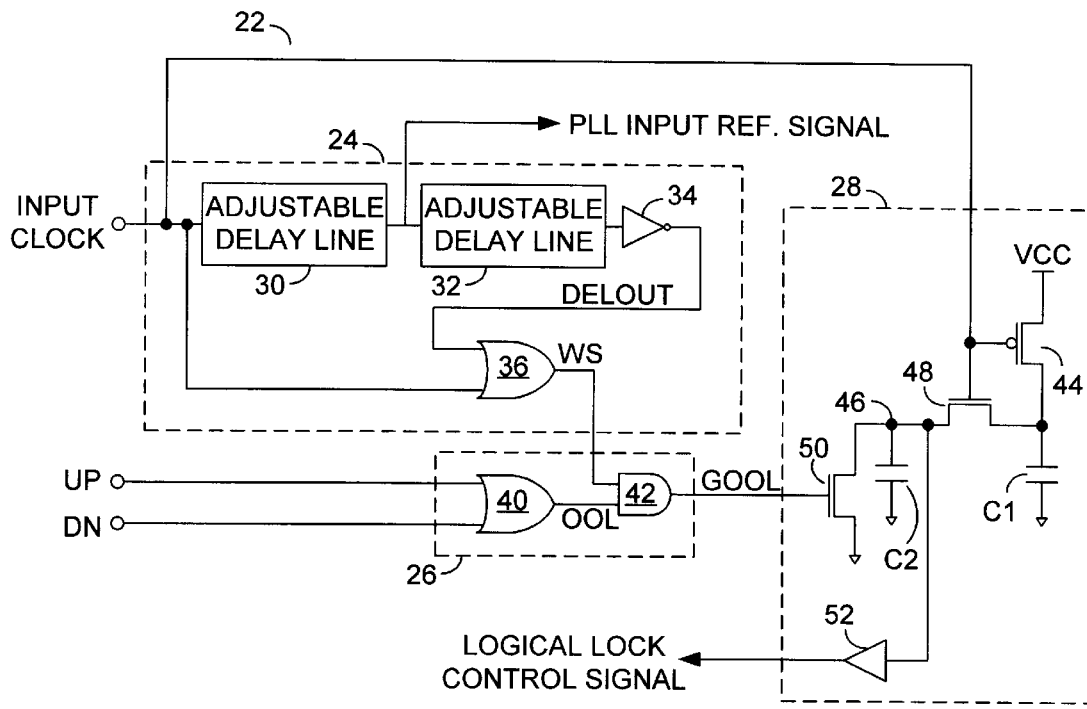
FIG. 2 is a simplified schematic and block diagram view showing a preferred lock detect circuit used in the embodiment illustrated in FIG. 1.

Referring now to FIG. 2, a simplified schematic and block diagram view of a preferred embodiment of lock detect circuit 22 is shown. Although a detailed description of the structure and operation of lock detect circuit 22 may be found in U.S. Ser. No. 08/622,539, a description sufficient for purposes of describing the present invention will be set forth immediately hereinafter. Lock detector 22 responds to the lock indicative signals (i.e., the UP and the DOWN signals) to generate a logical lock control signal which, when active, corresponds to a steady-state lock condition of PLL 20. Lock detector 22 may include means, such as window signal generator 24, for generating a window signal WS, means or circuit 26 for detecting when an actual out-of-lock (OOL) signal (e.g., the UP and DOWN signals) occurs outside of an acceptable phase error window, and means, such as an analog counter 28, for generating the logical lock control signal.

Windows signal generator 24 is responsive to an input clock for generating the window signal (WS). The window signal WS has a pulse width representative of, or, in other words, corresponding to, a predetermined acceptable phase error. The window signal WS is thus a pulse which defines an acceptable phase error window. The window signal generator 24 includes a first adjustable delay line 30, a second adjustable delay line 32, an inverter 34, and an OR gate 36. Delay lines 30 and 32 introduce first, and second amounts of delay, respectively, into the signal path of which they are a part. The first and second amounts of delay are adjustable. Structures for performing the delay function, adjustably, are conventional and well known.

Circuit 26 of lock detector 22 uses the UP, and DOWN signals generated by PLL 20 to generate a gated out-of-lock (GOOL) signal, when the actual out-of-lock (OOL) signals occur outside of an acceptable phase error window. Circuit 26 may take the form of an OR gate 40, and a disjunctive gating circuit, such as an AND gate 42.

Analog counter 28 includes a first capacitor C1, a first switch, such as a PMOS field effect transistor (FET) 44, a second capacitor C2, an output node 46, a second switch, such as an NMOS FET 48, a third switch, such as an NMOS FET 50, and a buffer 52.

It should be noted that the capacitance of C2 is relatively much larger than the capacitance of C1. Thus, while the gated out of-lock signal is inactive, each input clock cycle serves to charge C2 to a progressively higher voltage potential. When the voltage potential observed at output node 46 reaches a trip point associated with buffer 52, the logical lock control signal will be asserted. It should be appreciated that the particular trip point level of counter 28 may be varied for any particular desired configuration. In one embodiment, however, buffer 52 generates the logical lock control signal, in the absence of any active GOOL signals, in approximately 160 clock cycles. To the extent that PLL 20 is out-of-lock, (as conveyed to lock detector 22 by way of the UP and DOWN signals), transistor 50 will be controlled to conduct. This conduction discharges capacitor C2, thus deferring, or inhibiting entirely, generation of an active logical lock control signal.

Figure 3:
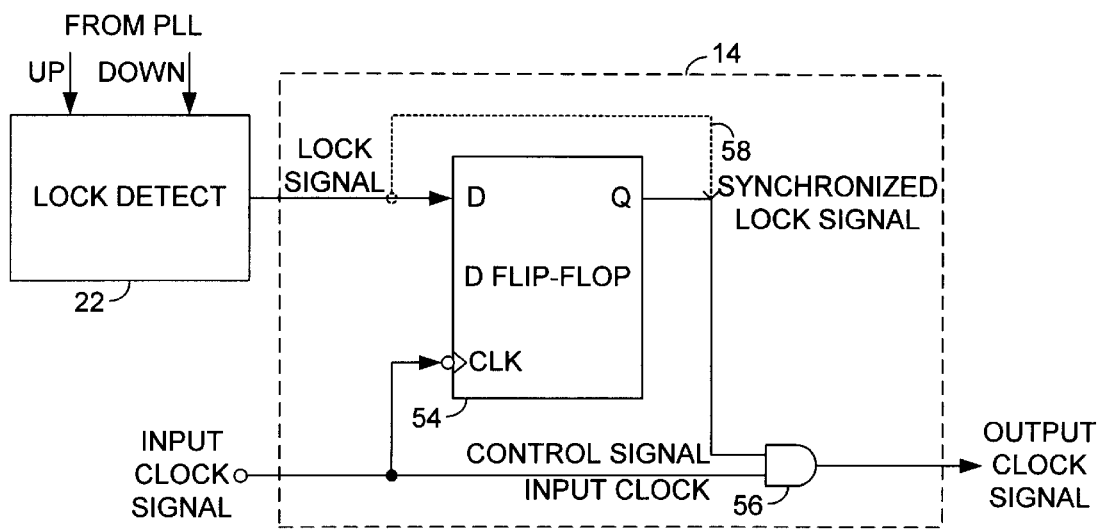
FIG. 3 is a simplified schematic and block diagram view showing, in greater detail, a preferred clock enable circuit shown in block diagram form in FIG. 1.

Referring now to FIG. 3, circuit 14 is provided for generating the output clock signal in a valid state when the lock signal is in the active state, and, for blanking the output clock signal when the lock signal is in the inactive state. Circuit 14 includes means, such as a negative edge triggered D-type flip-flop 54, for synchronizing the lock signal with respect to the input clock signal to generate a sampled, synchronized lock signal, and means, such as a logical AND-function gate 56, for generating the output clock signal when the synchronized lock signal (which defines a control signal applied thereto), is in the active state. GATE 56 "blanks" (i.e., holds low) the output clock signal when the control signal is inactive.

Flip-flop 54 is conventional, and well-known in the art and provides its well-known sampling function of data on its D-input, which is subsequently transferred to its Q-output, according to transitions on a clock input.

Gate 56 may comprise a two-input AND gate. However, it should be appreciated that there are a plurality of structures well-known and conventional in the art for disjunctively combining two or more inputs.

Figure 4A:
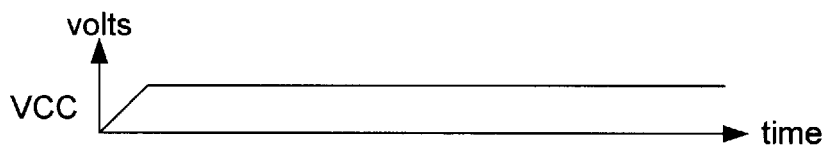
FIGS. 4A–4D are timing chart diagrams showing the operation of the clock enable circuit shown in FIG. 3.

Referring now to FIGS. 3, and 4A–4D, the operation of one embodiment of the invention will now be set forth. In particular, the timing diagrams shown in FIG. 4 correspond to a power up interval of chip 10, although the invention is not limited in just this interval. For example, frequency slewing, where the PLL input frequency is varied to effect a change in the PLL output, is also contemplated. In any event, FIG. 4A shows, during power up, the rise of a voltage level on a positive bus of a power supply from zero volts, to the device operating voltage level, indicated at $V_{cc}$. At this point, an input reference signal may be applied to device 10, and in particular, PLL 16.

Figure 4B:
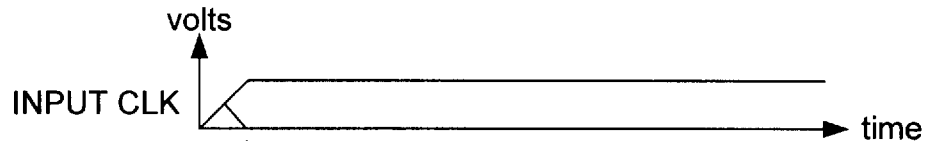

FIG. 4B shows the input clock signal, which is formed by the output reference signal of PLL 16.

Figure 4C:
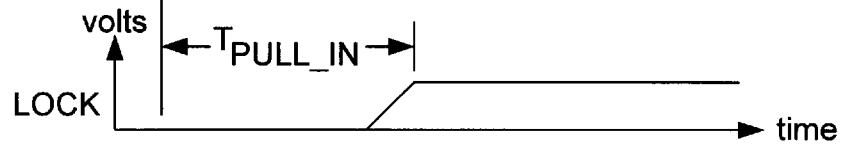
Figure 4D:
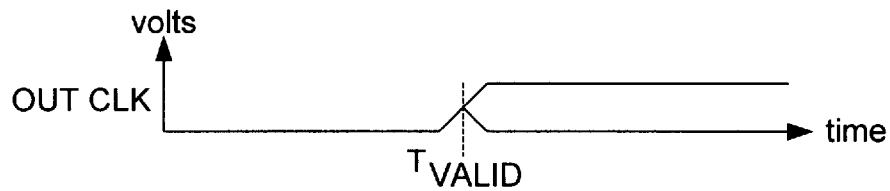

As shown in FIG. 4C, during an initial PLL "pull-in" process, indicated as occurring during $T_{pull\_in}$, the output reference signal of PLL 16 is not phase locked relative to the input reference signal. Accordingly, during this interval, the lock signal assumes an inactive state. As shown in FIG. 4D, when the lock signal is in the inactive state, the output clock signal is "blanked" (i.e., held low) by gate 56 (FIG. 3).

When the lock detect circuit 22, by way of the lock indicative signals (e.g., UP and DOWN signals 18), determines that the output reference signal (which, again, forms the input clock signal 20 to clock enable circuit 14) is both stable (i.e., no overshooting, or undershooting), and, at a valid frequency and phase relative to the input reference signal, it will generate the lock signal in an active state. As the lock signal becomes active (e.g., in the preferred embodiment, a logic high signal), it is sampled by flip-flop 54 and then coupled to gate 56 to thereby enable generation of a valid output clock signal. This is shown in FIG. 4D at time $T_{valid}$. In one embodiment, the pull-in time $T_{pull\_in}$, which includes, in actuality, a PLL pull-in component and a lock capture time (i.e., the time needed for analog counter 28 to indicate a logical lock signal), may be approximately 500 microseconds. This is a substantial improvement over existing techniques.

Figure 5A:
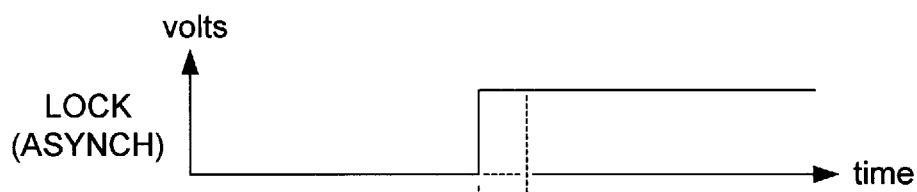
FIGS. 5A–5C is a simplified timing chart diagram view illustrating the synchronizing feature of the embodiment shown in FIG. 3.
Figure 5B:
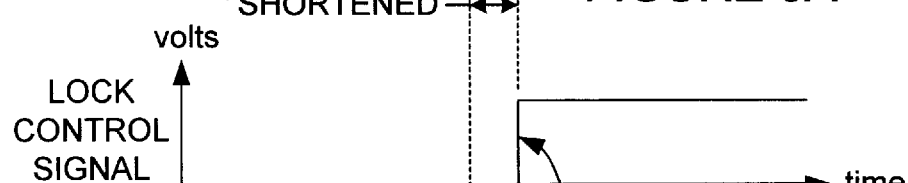
Figure 5C:
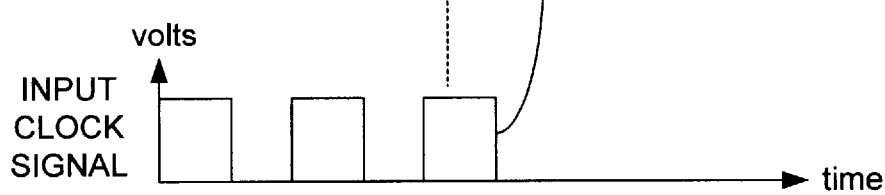

FIGS. 5A–5C illustrate in detail the synchronizing feature provided by flip-flop 54. It should be understood that the assertion of the lock signal by lock detect circuit 22 is essentially asynchronous relative to the input clock signal. Accordingly, it may occur at any time. In considering FIGS. 5A and 5C in particular, if the lock signal were to occur while the input clock signal assumed a logic high state, then gate 56 would generate an initial, positive clock pulse that is shortened relative to a normal duration (pulse width) positive pulse of the output clock signal. An exemplary pulse width of such a shortened initial pulse is indicated as $T_{shortened}$ in FIG. 5B. Flip-flop 54 thus essentially synchronizes the lock signal relative to the transitions of the input clock signal to generate a synchronized lock signal. This is shown in FIG. 5B. The rising edge of the synchronized lock signal coincides with the falling edge of input clock signal. Through this synchronization mechanism, the present invention provides for uniform duration positive pulses of the output clock signal, including the initial pulse under circumstance of an asynchronously asserted lock signal. However, if such an initial, shortened output clock pulse does not present a problem to downstream components or devices, or is otherwise desirable, then flip-flop 54 may be removed, and, as shown in FIG. 3, the lock signal may be directly coupled to gate 56 by way of connector 58. In this alternate embodiment, elimination of a component may be desirable in certain circumstances. Therefore, the control signal which is applied to AND gate 56 includes either a synchronized lock signal, or an asynchronously asserted lock signal, depending on the embodiment.

It should be understood that circuit 14 may be conveniently implemented using a computing element programmed according to the teachings of the present specification, as will be apparent to those skilled in the art. In particular, the lock control signal may be provided to a programmed control module which, in turn, will enable output of a clock signal. Appropriate software coding can readily be prepared by skilled programmers based on the teachings of the present disclosure, as will be apparent to those of ordinary skill in the art. The present invention thus also includes a computer program product which may comprise a storage medium including instructions which can be used to program a computer to perform a process of the invention. The storage medium can include, but is not limited to, any type of disk including floppy disks, optical disks, CD-ROMs and magneto-optical disks, ROMS, RAMS, EPROMS, EEPROMS, magnetic or optical cards, or any type of medium suitable for storing electronic instructions.

Figure 6:
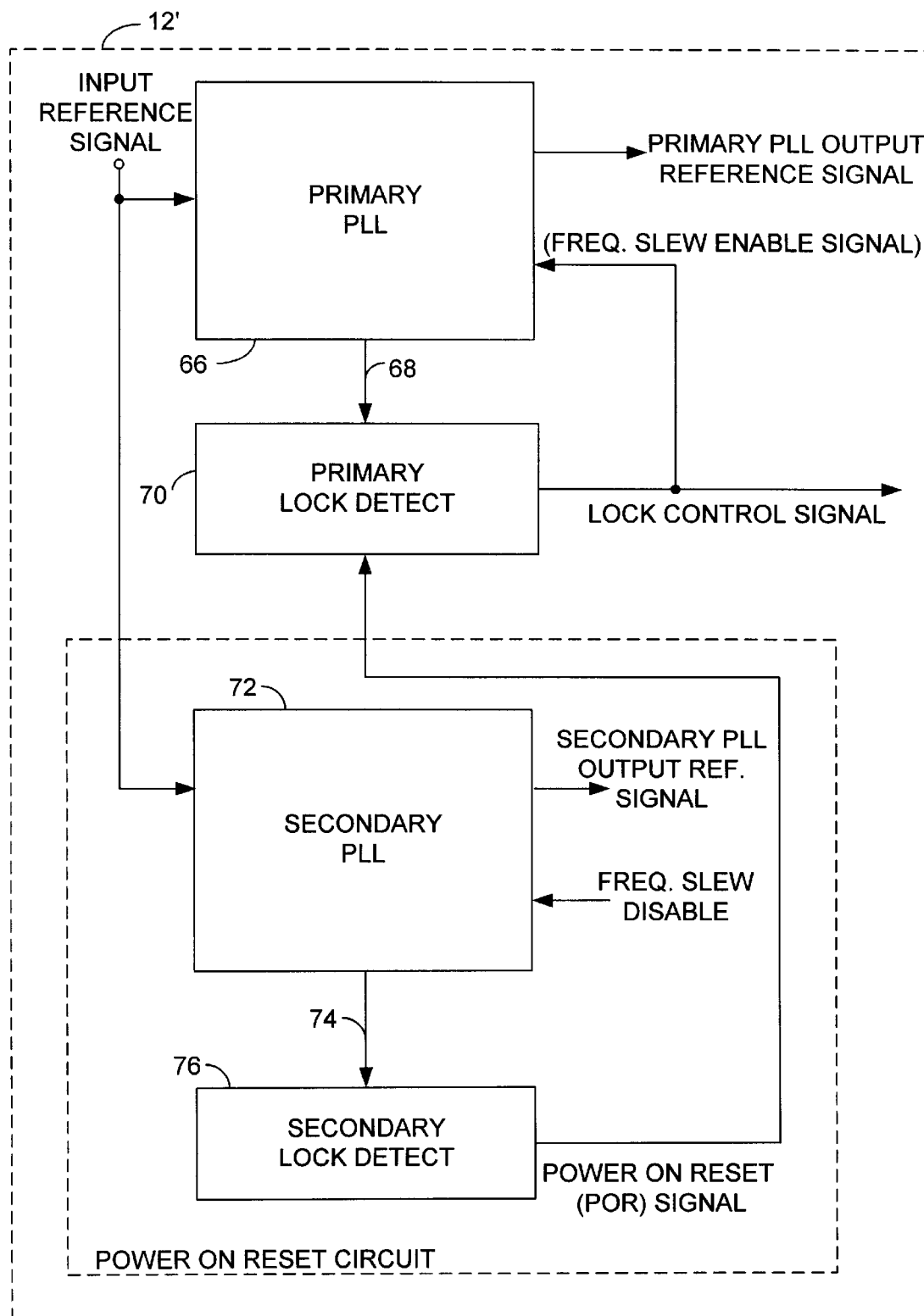
FIG. 6 is a simplified schematic and block diagram view showing an alternate, multiple PLL embodiment of the lock detect circuit shown in FIG. 2.

FIG. 6 shows a second, multi-PLL embodiment of the means for generating the lock control signal. Specifically, lock control signal generating means 12' is used to guarantee a power-on-reset function upon power up of clock generator 10. Circuit 12' includes a primary PLL circuit 66 generating a primary lock indicative signal 68, a primary lock detector 70, a secondary PLL circuit 72 generating a secondary lock indicative signal 74, and a secondary lock detect circuit 76. Circuit 12' corresponds substantially to a dual-mode-of-operation frequency-generating apparatus disclosed in copending patent application entitled "AN APPARATUS FOR FAST PHASE-LOCKED LOOP FREQUENCY SLEWING DURING POWER ON", Ser. No.: 08/622,531, filed Mar. 25, 1996, and assigned to the common assignee of the present invention. Although a detailed description may be found in Ser. No. 08/622,531, a description of circuit 12' sufficient for purposes of the present invention will be set forth immediately hereinafter.

Primary PLL 66 includes two distinct modes of operation; namely, a non-frequency slewing mode of operation for use, for example, during power-up for providing a fast PLL lock, and, a second, frequency-slewing mode for use during normal operation to provide relatively slow, controlled frequency rate changes. The mode is selected using a frequency slewing enable signal, as shown in FIG. 6. This enable signal is defined by the lock control signal generated by primary lock detector 70. When the frequency slewing enable signal is active, the frequency-slewing mode is enabled. However, when the frequency slewing enable signal is inactive, a fast, non-frequency slewing mode of operation will be selected.

Primary lock indicative signal 68 may comprise, for example, in a charge pump embodiment of PLL 66, the well-known UP and DOWN signals.

Primary lock detect circuit 70 is used to generate the lock control signal when the primary PLL output reference signal is phase locked to the input reference signal, and, a power-on-reset signal (essentially used as an enable signal) from secondary lock detect circuit 76 is in an active state.

Secondary PLL 72, and secondary lock detect circuit 76 form, in function, a novel power-on-reset circuit. Secondary PLL may be a conventional PLL (i.e., one does not include a second, frequency slewing mode), since, such a mode would be disabled in any event.

Secondary lock indicative signal 74 may comprise an UP signal and a DOWN signal for a charge pump based PLL 72.

Secondary lock detector 76 operates to generate the power-on-reset signal when the secondary PLL output reference signal is phase locked to the input reference signal. As noted in Ser. No. 08/622,531, secondary PLL output reference signal has an output frequency that is lower than the output frequency of the primary PLL output reference signal, and, further, the acceptable phase error permitted by secondary lock detect 76 is greater than that permitted by primary lock detect circuit 70. Therefore, secondary lock detect 76 will likely indicate lock (by asserting the power-on-reset signal) before primary lock detector 70.

This power-on-reset signal is then used to enable primary lock detect circuit 70 for outputting the lock control signal for use in the present invention (i.e., it is coupled to circuit 14 to enable output of the clock signal). One operational characteristic of primary PLL 66 is that once the lock control signal is activated by detector 70, thus enabling the frequency slewing mode of operation, primary PLL 66 operates to modify the lock indicative signal 68 (e.g., UP and DOWN signals) so that primary lock detect circuit 70 will thereafter, until powered down, report a locked condition. Since circuit 70 will maintain the lock control signal in the active state, the modification (e.g., truncation according to a phase error window signal, as described in Ser. No. 08/622,531) to the UP and DOWN signal will thereafter always occur until the device is powered down. The PLL 66 thus includes means for modifying the lock indicative signal to maintain the lock signal produced by detector 70 in an active state until powered off. This may be desirable, for example, when frequency slewing is necessary or desirable, since the output of gate 56 will be maintained as an output, thus providing the capability of frequency slewing on such output.

One purpose of the second embodiment, which uses lock control signal generating means 12', is thus to guarantee the power-on-reset function. Another is to permit frequency slewing while still generating an output clock signal. In this second embodiment, the output of the primary lock detector 70 is provided to flip-flop 54, as shown in FIG. 3. One advantage of this two PLL lock detect embodiment, as described above, is that once the output is "locked", the lock signal will thereafter remain asserted (i.e., in the active state) until device 10 is powered off. Using circuit 12' that includes means for maintaining the lock signal in an active state, allows frequency slewing to occur without blanking the output clock signal. This may be desirable, depending upon the overall system design.

An embodiment according to the present invention blocks an output clock signal until such signal is both stable, and has reached a valid frequency. It accomplishes this function by using a control signal corresponding to a lock state of a PLL. Such an embodiment does not require the use of a conventional power-on-reset circuit, and in addition, such an embodiment only disables the output until the output clock signal is valid. Conventional designs, in contrast, include a relatively long, predetermined delay which must accommodate the worst case PLL lock time. This sometimes results in a delay that is longer than necessary.

While the present invention has been particularly shown and described with reference to the preferred embodiments thereof, it is well understood by those skilled in the art that various changes and modifications can be made in the invention without departing from the spirit and scope thereof, which is limited only by the appended claims. For example, although many of the signals were described as being either active-low, or active-high, it should be appreciated that complementary logic relative to that described herein is fully within the spirit and scope of the present invention.

I claim:

1. A method of operating a clock signal generator comprising the step of:
    generating a lock signal in response to (i) a window signal and (ii) one or more control signals; and
    generating an output clock signal in response to (i) an input clock signal and (ii) said lock signal, wherein said lock signal corresponds to a lock state of a phase locked loop (PLL).

2. The method of claim 1 wherein said step of generating the output clock signal includes the substep of:
    blanking the output clock signal when the lock signal is in an inactive state indicative of a condition where the PLL is unlocked.

3. The method of claim 1 wherein said step of generating the output clock signal includes the substep of:
    generating the output clock signal in a valid state when the lock signal is in an active state indicative of a condition where the PLL is locked.

4. The method of claim 1 wherein said step of generating the output clock signal includes the substep of:
    disjunctively combining the input clock signal and the lock signal so that when the lock signal is in an inactive state the output clock signal is blanked and when the lock signal is in an active state the output clock signal is generated in a valid state.

5. The method of claim 1 further comprising the step of:
    synchronizing the lock signal with respect to the input clock signal to generate a synchronized lock signal to thereby prevent generation of an initial foreshortened pulse portion of the output clock signal; and
    wherein said step of generating the output clock signal includes the substep of disjunctively combining the input clock signal and the synchronized lock signal so that when the synchronized lock signal is in an inactive state the output clock signal is blanked and when the synchronized lock signal is in an active state the output clock signal is generated in a valid state.

6. The method of claim 1 further comprising the steps of:
    applying an input reference signal to the PLL; and,
    generating the lock signal when an output reference signal of the PLL is phase locked relative to the input reference signal.

7. The method of claim 6 wherein the output reference signal defines the input clock signal.

8. The method of claim 6 further including the steps of:
    varying the input reference signal to the PLL to thereby effect frequency slewing in the output reference signal;
    generating the lock signal in an inactive state when the output reference signal of the PLL is out-of-lock relative to the input reference signal; and,
    wherein said step of generating the output clock signal includes the substep of blanking the output clock signal when the lock signal is in the inactive state.

9. The method of claim 1 further comprising the steps of:
    applying an input reference signal to the PLL;
    generating the lock signal when an output reference signal of the PLL is outside of a predetermined tolerance defined by said window signal;
    synchronizing the lock signal with respect to the input clock signal to generate a synchronized lock signal, said output reference signal defining the input clock signal; and,
    wherein said step of generating said output clock signal includes the substep of disjunctively combining the input clock signal and the synchronized lock signal so that when the synchronized lock signal is in an inactive state the output clock signal is blanked and when the synchronized lock signal is in an active state the output clock signal is generated in a valid state.

10. The method of claim 1 wherein the PLL is a primary PLL, said method further including the steps of:
    applying an input reference signal to the primary PLL and a secondary PLL;
    generating a power-on-reset signal when a secondary PLL output reference signal is phase locked to the input reference signal;
    generating the lock signal in an active state when the primary PLL output reference signal is phase locked to the input reference signal and the power-on-reset signal is in an active state; and,
    maintaining the lock signal in the active state while frequency slewing.

11. A clock circuit comprising:
    means for generating a lock signal in response to (i) a window signal and (ii) one or more control signals, said lock signal corresponding to a lock state of a phase locked loop (PLL) when an output reference signal of said PLL is phase locked relative to an input reference signal of said PLL; and,
    means responsive to an input clock signal for generating an output clock signal according to a control signal corresponding to said lock signal.

12. The clock circuit of claim 11 further including:
    means for synchronizing said lock signal with respect to the input clock signal to generate a synchronized lock signal wherein said synchronized lock signal defines said control signal.

13. The clock circuit of claim 12 wherein said lock signal generating means includes a lock detector for generating the lock signal according to a lock indicative signal produced by said PLL representative of the extent to which said output reference signal is phase locked relative to said input reference signal.

14. The clock circuit of claim 12 wherein said output clock signal generating means includes an AND gate having a pair of input terminals for receiving said control signal and said input clock signal.

15. The clock circuit of claim 12 wherein said sychronizing means includes a D-type flip flop having a data input terminal for receiving said lock signal, a clock terminal for receiving said input clock signal, and a data output terminal for outputting said sychronized lock signal defining said control signal.

16. The clock circuit of claim 12 wherein said PLL is a primary PLL, said output reference signal is a primary PLL output reference signal, said primary PLL including an output terminal for generating a primary lock indicative signal, and said lock signal generating means comprises a primary lock detector responsive to said primary lock indicative signal, said clock circuit further including:

a secondary PLL responsive to said input reference signal for generating a secondary PLL output reference signal and a secondary lock indicative signal on respective output terminals thereof; and, a secondary lock detector responsive to said secondary lock indicative signal for generating a power-on-reset signal indicative of a lock state of said secondary PLL;

wherein said primary lock detector is configurable to generate said lock signal in an active state when said primary PLL output reference signal is phase locked to said input reference signal and said power-on-reset signal is in an active state; and, wherein said primary PLL includes means for maintaining said lock signal in said active state while frequency slewing.

17. A clock circuit comprising:

a lock detector having an output terminal for generating a lock signal in response to (i) a window signal and (ii) one or more control signals, said lock signal corresponding to a lock state of a phase locked loop (PLL) when an output reference signal of said PLL is phase locked relative to an input reference signal of said PLL; and, a logic gate having a first input terminal for receiving an input clock signal and a second input terminal for receiving a control signal corresponding to said lock signal, said logic gate having an output terminal for generating an output clock signal in a valid state when said control signal is in an active state indicative of a lock state where said PLL is locked, said logic gate blanking said output clock signal when said control signal is in an inactive state indicative of a lock state where said PLL is unlocked.

18. The clock circuit of claim 17 further including:

a synchronizing circuit configured to synchronize said lock signal relative to said input clock signal to generate a synchronized lock signal wherein said synchronized lock signal defines said control signal.

19. The clock circuit of claim 18 wherein said lock detector generates said lock signal according to a lock indicative signal produced by said PLL representative of the extent to which said output reference signal is phase locked relative to said input reference signal.

20. The clock circuit of claim 18 wherein said logic gate comprises an AND gate having a pair of input terminals for receiving said control signal and said input clock signal.

21. The clock circuit of claim 18 wherein said synchronizing circuit includes a D-type flip flop having a data input terminal for receiving said lock signal, an clock terminal for receiving said input clock signal, and a data output terminal for outputting said synchronized lock signal defining said control signal.

22. The clock circuit of claim 18 wherein said lock detector generates said lock signal according to a lock indicative signal produced by said PLL representative of the extent to which said output reference signal is phase locked relative to said input reference signal, said logic gate comprises an AND gate having a pair of input terminals for receiving said control signal and said input clock signal, and said synchronizing circuit includes a D-type flip flop having a data input terminal for receiving said lock signal, an clock terminal for receiving said input clock signal, and a data output terminal for outputting said synchronized lock signal defining said control signal.

* * * * *